United States Patent
Ramet et al.

(10) Patent No.: US 6,169,446 B1
(45) Date of Patent: Jan. 2, 2001

(54) TIME CONSTANT CALIBRATION DEVICE

(75) Inventors: Serge Ramet, Grenoble; François Van Zanten, Meylan, both of (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/251,360

(22) Filed: Feb. 17, 1999

(30) Foreign Application Priority Data

Feb. 19, 1998 (FR) .................................................. 98 02222

(51) Int. Cl.$^7$ ..................................................... H03B 1/00
(52) U.S. Cl. ........................................... 327/554; 327/558
(58) Field of Search .................................. 327/554, 558, 327/344

(56) References Cited

U.S. PATENT DOCUMENTS 4,691,171  9/1987  Van Roermund et al. ........... 328/167
5,796,545 * 8/1998  Canclini ............................ 360/78.04

OTHER PUBLICATIONS

French Search Report from French Patent Application 98 02222, filed Feb. 19, 1998.

* cited by examiner

Primary Examiner—Margaret R. Wambach
Assistant Examiner—Cassandra Cox
(74) Attorney, Agent, or Firm—Wolf, Greenfield & Sacks, P.C.; James H. Morris; Theodore E. Galanthay

(57) ABSTRACT

The present invention relates to a circuit including at least one analog processing cell having a time constant determined by a capacitor and a resistor. A calibration circuit comprises a bridge formed of a switched-capacitance resistor and of a resistor adjustable by means of a digital control signal; and a feedback loop to adjust the digital control signal so that the voltage at the midpoint of the bridge is equal to a predetermined fraction of the voltage applied across the bridge. The resistor of the processing cell is also adjustable by the digital control signal.

7 Claims, 2 Drawing Sheets

TIME CONSTANT CALIBRATION DEVICE

BACKGROUND OF THE INVENTION

1. Field of the Invention

The present invention relates to an analog circuit comprising various signal processing cells, especially filters, the time constants of which have to be precise. The present invention more specifically aims at a device for automatically calibrating these time constants.

2. Discussion of the Related Art

Integration technologies do not enable implementation of passive components, such as resistors and capacitors, with accurate absolute values. However, integration technologies do allow obtaining a good relative precision between components of the same nature (on the order of 1%).

To obtain time constants which are accurate in absolute value, switched-capacitance filters are generally used. The precision is then obtained due to the fact that the RC time constants are proportional to a ratio of capacitances. Indeed, in switched-capacitor techniques, a resistance R is obtained from a switched capacitor and its value is equal to $T/C_r$, where T is the switching period and $C_r$ the value of the switched capacitor. The precision of period T is excellent, since it is obtained from a quartz crystal oscillator time base.

However, switched-capacitor systems are sampled-time systems and accordingly have the disadvantage of being sensitive to aliasing phenomena (indiscernibility between a signal of frequency f and a signal of frequency NF±f, where F is the sampling frequency and N is an integer). This is an important limitation to their use on integrated circuits where a high number of signals of different frequencies (that may not be related by a simple multiplicity ratio) have to be processed.

Another disadvantage of sampled-time systems is the speed limitation of the signals by the sampling frequency which must often be much higher than the theoretical Shannon limit (oversampling). This sampling frequency is indeed limited by the component technology.

To obtain a precise filtering in this case, external passive components that the user must adjust or select from among particularly costly precision passive components are generally used.

SUMMARY OF THE INVENTION

An object of the present invention is to provide an integrated circuit capable, without external components, of accurately processing analog signals, the frequency of which is close to technological limits.

To achieve this and other objects, the present invention provides a feedback loop which controls the value of an adjustable passive resistor with the value of a switched-capacitance resistor. The control signal of the adjustable resistor is applied to adjustable resistors of the same nature which affect time constants which are desired accurate.

This enables correlation of the values of the adjustable resistors to the inverses of the values of the capacitances and to obtain RC time constants as accurate as those obtained with switched capacitance techniques, without using switched capacitors in the paths of signals to be processed.

The present invention more specifically relates to a circuit comprising at least one analog processing cell having a time constant determined by a capacitor and a resistor. A calibration circuit comprises a bridge formed of a switched-capacitance resistor and of a resistor adjustable by means of a digital control signal; and a feedback loop to adjust the digital control signal so that the voltage at the midpoint of the bridge is equal to a predetermined fraction of the voltage applied across the bridge. The resistor of the processing cell is also adjustable by the digital control signal.

According to an embodiment of the present invention, the feedback loop successively includes an integrator; a window comparator providing an upper overflow signal when the output of the integrator exceeds a high threshold and a lower overflow signal when the output of the integrator falls under a low threshold; and a counter, the content of which, corresponding to the digital control signal, is modified by increments in a first direction by one of the overflow signals and in the reverse direction by the other one of the overflow signals.

According to an embodiment of the present invention, the circuit comprises a second counter, the content of which corresponds to the digital signal servo controlling the resistor of the processing cell, and means for controlling the content of the second counter to the content of the first counter, with a difference of at most one unit.

According to an embodiment of the present invention, the circuit comprises means for making the content of the second counter tend towards a stop value when the first counter is in an overflow condition.

According to an embodiment of the present invention, the feedback loop adjusts the digital control signal so that the voltage at the midpoint of the bridge is equal to half the voltage applied across the bridge.

The foregoing objects, features and advantages of the present invention will be discussed in detail in the following non-limiting description of specific embodiments in connection with the accompanying drawings.

DETAILED DESCRIPTION

Figure 1:
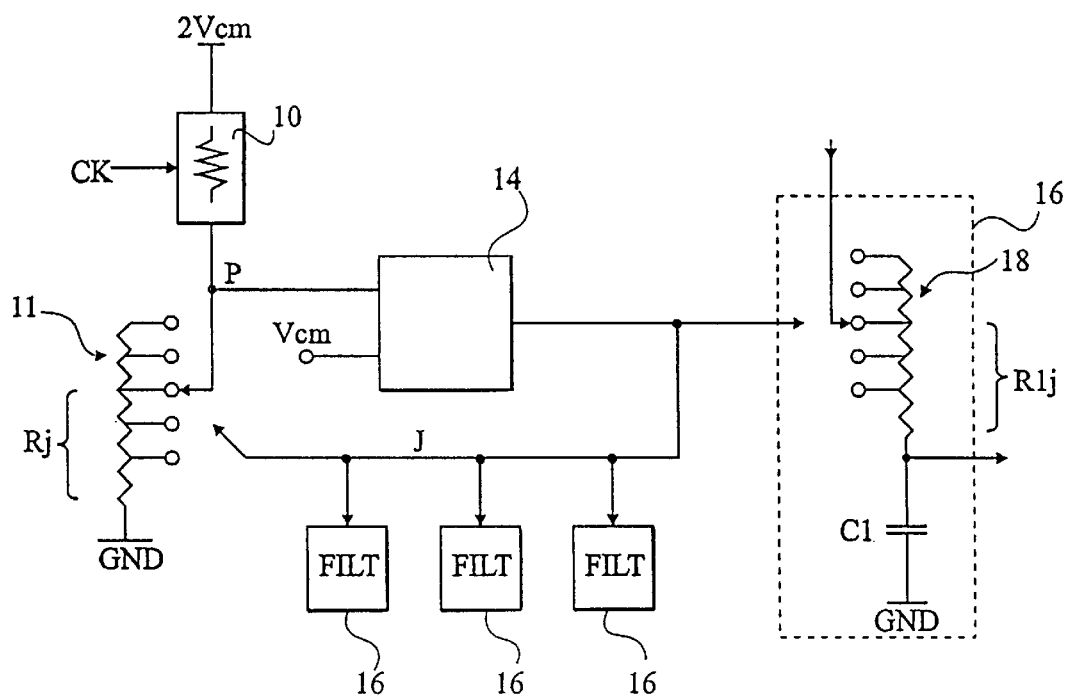
FIG. 1 schematically shows an embodiment of a device according to the present invention of automatic calibration of resistors of signal processing cells.

In FIG. 1, a calibration device according to the present invention comprises a dividing bridge formed of a switched-capacitance resistor 10 and of an adjustable resistor 11. The bridge is connected between a high potential 2Vcm and a low potential GND. Value Rj of adjustable resistor 11 is determined by a control signal J provided by a feedback element 14. The feedback loop formed of element 14 and of resistor 11 acts to adjust the voltage of the midpoint P of the bridge to the half Vcm of the voltage which supplies the bridge.

Adjustable resistor 11 is formed of passive resistors. In order to achieve this, as shown, resistor 11 may be formed of several resistors connected in series, control signal J being digital and selecting one of the interconnection points of these resistors.

Thereby, a passive resistor Rj of value equal to that of switched-capacitance resistor 10 is obtained. In other words, if C0 is the value of the capacitance used in switched-capacitance resistor 10, and T is the period of switching signal CK, then Rj=T/C0, or RjC0=T. Thus, time constant RjC0 has a precision indexed on the period of clock signal CK.

The resistors which intervene in time constants which are desired to be precise in filters 16 or other processing elements are adjustable resistors of the type of resistor 11, all controlled by digital signal J provided by feedback element 14.

As an example, one of filters 16 is shown as a first order low-pass filter comprising an adjustable resistor 18 and a capacitor C1, connected in series. Control signal J adjusts the value of resistor 18 to R1j. The time constant of this filter thus is equal to R1jC1. If $k_r$ is the ratio between the values of the resistors forming adjustable resistor 18 and the values of the resistors forming adjustable resistor 11, and if $k_c$ is the ratio of the value of capacitor C1 and of that of capacitor C0 of switched-capacitance resistor 10, the time constant of low-pass filter 16 is expressed as $k_r k_c RjC0$. This time constant can be obtained in a particularly precise way, since product RjC0 is known with the precision of clock CK and the precision of coefficients $k_r$ and $k_c$ is the relative precision of the resistors and of the capacitors in the technology used, which precision generally is on the order of 1%.

Figure 2:
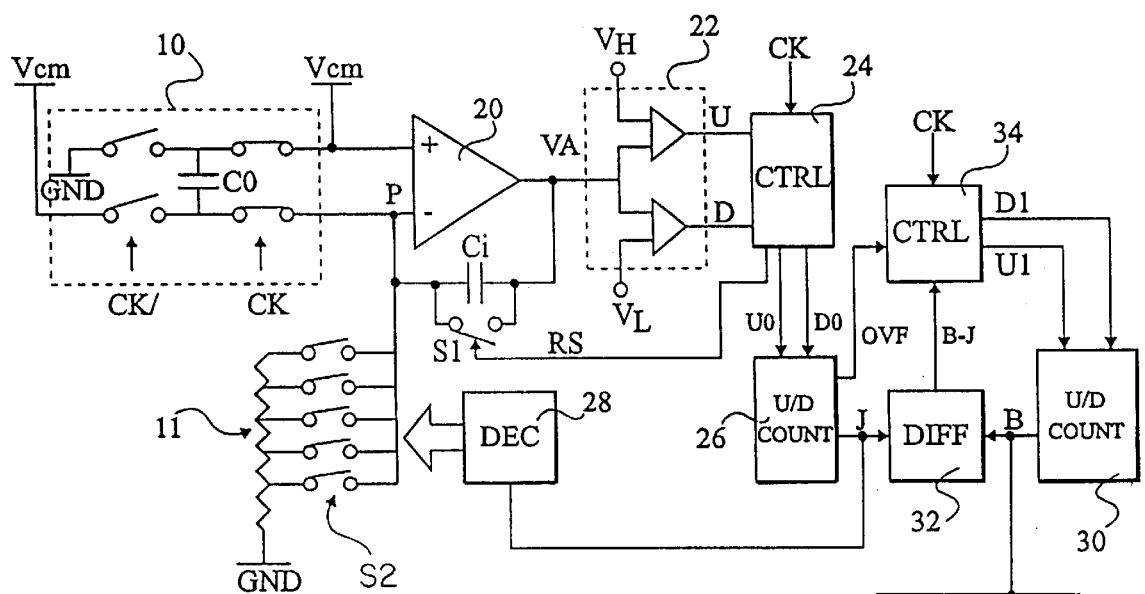
FIG. 2 shows a more detailed example of the embodiment of the device of FIG. 1.

FIG. 2 shows a particularly advantageous embodiment of feedback element 14. The structure of switched-capacitance resistor 10 has also been shown in more detail. Switched-capacitance resistor 10 comprises four switches controlled by clock signal CK and its complement CK/ so that capacitor C0 is, during a phase of clock CK, connected between a potential Vcm and the midpoint P of the bridge and, during the other phase, reverse-connected between potential Vcm and low potential GND. Element 10 is equivalent to a resistor connected between midpoint P and a potential 2Vcm.

The feedback element comprises an integrator formed of an operational amplifier 20, the output and the inverting input of which are interconnected by an integrating capacitor Ci. The inverting input of amplifier 20 is connected to midpoint P while its non-inverting input is connected to potential Vcm. Output VA of integrator 20 is connected to a window comparator 22 which provides a pulse U when voltage VA exceeds a high threshold $V_H$ and a pulse D when voltage VA falls under a low threshold $V_L$.

A shaping circuit 24 provides logic signals U0 and D0 respectively corresponding to pulses U and D synchronized on clock CK. Further, circuit 24 provides a reset signal RS to integrator 20 upon each occurrence of a pulse U or D. Signal RS closes a switch S1 to discharge integrating capacitor Ci.

Signals U0 and D0 are provided to an up-downcounter 26. Each pulse U0 increments counter 26 by one unit, while each pulse D0 decrements this counter by one unit. The content J of counter 26 corresponds to control signal J of FIG. 1.

If adjustable resistor 11 is formed of several series resistors of same value, their interconnection nodes are connected to midpoint P by respective switches S2. Control signal J is provided to a decoder 28 which closes a single one of switches S2 according to the value of signal J.

As in any digital control system, control signal J has a jitter of more or less one unit due to the fact that the exact adjustment is located between two digital values differing by their least significant bit. This jitter should not be transmitted to the analog filters 16 to be calibrated by the circuit. Still undescribed circuits are used to transmit to filters 16 a calibration control signal B which is free of jitter.

Signal B, corresponding to the content of an up-downcounter 30, and signal J, are provided to a subtractor 32. The result B−J of the subtraction is provided to a control circuit 34 which, according to this result, sends to counter 30 incrementation or decrementation pulses U1 or D1 based on clock CK. More specifically, when difference B−J is strictly higher than 1, control circuit 34 transmits decrementation pulses D1. When difference B−J is strictly lower than −1, control circuit 34 transmits incrementation pulses U1. Otherwise, when difference B−J is between −1 and 1, control circuit 34 is inactive. In other words, as long as signal J has a normal jitter of plus or minus one unit, control signal B remains constant. Conversely, if signal J varies regularly, for example, upon a first setting upon power-on, control circuit 34 causes a modification of the content of counter 30, so that value B follows value J.

In fact, value B will follow value J with an interval of one unit. If, in a specific case, the proper setting is stopped, that is, on the first or last setting of resistor 11, value J would stabilize to its maximum or minimum value, while value B would stabilize at an interval of one unit from value J, which reduces the excursion range of value B.

To avoid this, control circuit 34 takes account of an overflow signal OVF which is activated when counter 26 is stopped low or high. When difference B−J is negative and signal OVF is active, this means that the setting is stopped high. In this case, control signal 34 transmits an incrementation pulse U1, which brings value B to the maximum value. When difference B−J is positive and signal OVF is active, a low stop setting has been reached. Control signal 34 transmits a decrementation pulse D1 which brings signal B down to the minimum value.

Figure 3:
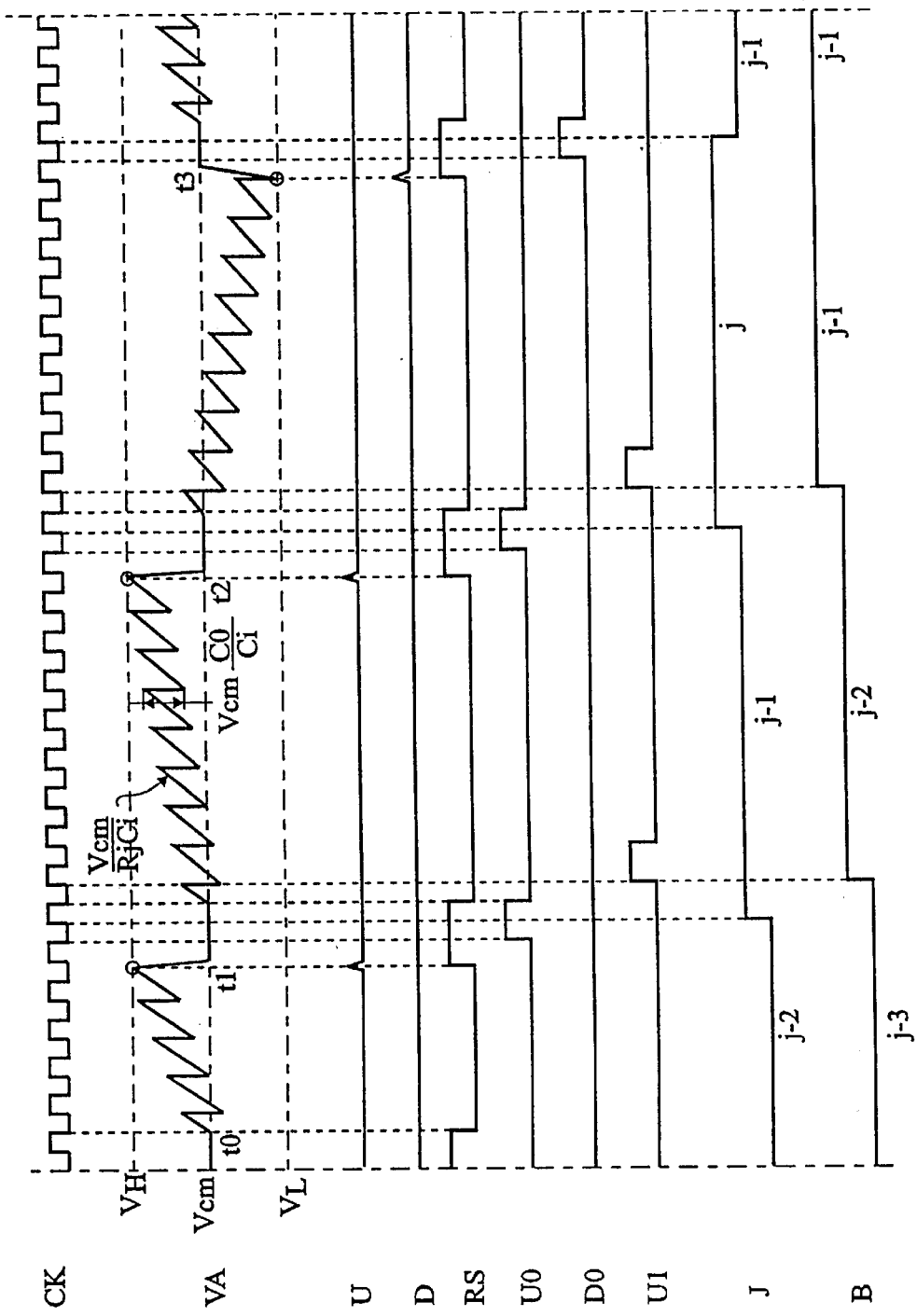
FIG. 3 shows a timing diagram illustrating the operation of the circuit of FIG. 2.

FIG. 3 illustrates the operation of the circuit of FIG. 2 by an example of variation of various signals. At each low phase of clock signal CK, capacitor C0 of switched-capacitance resistor 10 is connected between potentials Vcm and GND so that is charges in reverse to voltage Vcm. Integrator 20-Ci then operates by integrating the constant value of current.

$$\frac{Vcm}{Rj}.$$

Its output voltage VA increases linearly with a slope Vcm/RjCi.

When signal CK switches to the high state, capacitor C0, charged to −Vcm, is connected between potential Vcm and node P. Its charge VcmC0 is totally transferred into capacitor Ci, since amplifier 20 maintains the potential of node P at Vcm. This charge transfer causes a negative variation of voltage VA equal to VcmC0/Ci.

At a time t0, upon a falling edge of clock signal CK, reset signal RS becomes inactive, which makes integrator 20 operational. Signal VA starts to increase linearly with a slope Vcm/RjCi. Upon each subsequent rising edge of clock signal CK, signal VA undergoes a drop of VcmC0/Ci. In the present example, resistor Rj is adjusted to too low a value, whereby upon each rising edge of signal CK, signal VA reaches a maximum value higher than that reached upon the preceding rising edge of signal CK. Signal VA is thus generally increasing and reaches high threshold $V_H$ at a time t1. This generates a pulse U which is transformed into a reset signal RS and into a pulse U0 to increment the content of counter 26.

As shown, content J of the counter passes from a value j−2 to a value j−1. Assuming that the content B of counter 30 was at a value j−3, the interval between values J and B exceeds one unit. Accordingly, control circuit 34 transmits an incrementation pulse U1 which brings value B to j−2 and to a one-unit interval with value J.

As soon a signal RS is deactivated, the integrator is freed to start a new cycle similar to that started at time t0. The new value of resistor Rj still is too low, whereby voltage VA generally increases, slower however than at the preceding cycle. At a time t2, signal VA reaches high threshold $V_H$ again, which causes, in addition to the resetting RS, a new incrementation of counter 26. The content J of counter 26 passes from j−1 to j. The interval with value B exceeds 1 again, which causes a new activation of signal U1 to increment the content B of counter 30. Value B then passes to j−1.

The value of resistor Rj now is too high. Thus, as soon as signal RS is deactivated, signal VA generally decreases and reaches low threshold VL at a time t3, where window comparator 22 generates a pulse D. Pulse D causes a new provision of a reset pulse RS and the provision of a pulse D0 of decrementation of the content of counter 26. Thus, value J passes from j to j−1. Since value B is already equal to j−1, that is, the interval between values J and B is lower than 1, this value B is not modified.

When signal RS is deactivated again, a new integration cycle starts. In the general case, signal VA will start generally increasing again, as is shown. Of course, the present invention is likely to have various alterations, modifications, and improvements which will readily occur to those skilled in the art. In particular, a system which adjusts resistance 11 to the same value as switched-capacitance resistance 10 has been described.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit that includes at least one analog processing cell having a time constant determined by a capacitor and a resistor, the circuit including a calibration circuit comprising:

a bridge formed of a switched-capacitance resistor and of a resistor adjustable by a digital control signal; and a feedback loop to adjust the digital control signal so that a voltage at a midpoint of the bridge is equal to a predetermined fraction of a voltage applied across the bridge;

wherein the resistor of the processing cell is also adjustable by the digital control signal.

2. The circuit of claim 1, wherein the feedback loop includes:

an integrator having an input that is coupled to the midpoint of the bridge and an output;

a window comparator, coupled to the output of the integrator, that provides an upper overflow signal when the output of the integrator exceeds a high threshold and a lower overflow signal when the output of the integrator falls under a low threshold; and a counter, coupled to the window comparator, that provides the digital control signal, the digital control signal being modified by increments in a first direction by one of the upper and lower overflow signals and in a second direction that is opposite to the first direction by the other one of the upper and lower overflow signals.

3. The circuit of claim 2, wherein the counter is a first counter and the calibration circuit further comprises:

a second counter, coupled to the first counter, that provides a calibration signal which corresponds to the digital control signal and adjusts the resistor of the processing cell; and means for servo-controlling the calibration signal to the digital control signal with a difference of at most one unit.

4. The circuit of claim 3, wherein the calibration circuit further comprises means for making the calibration signal tend towards a stop value when the first counter is in an overflow condition.

5. The circuit of claim 4, wherein the feedback loop adjusts the digital control signal so that the voltage at the midpoint of the bridge is equal to half the voltage applied across the bridge.

6. The circuit of claim 3, wherein the calibration circuit further comprises:

a subtraction circuit, coupled to the first counter, the second counter, and the means for servo-controlling, that receives the digital control signal and the calibration signal and provides a differential signal corresponding to a difference between the digital control signal and the calibration signal to the means for servo-controlling.

7. The circuit of claim 2, wherein the feedback loop further includes:

a shaper circuit, coupled between the window comparator and the first counter, that receives the upper and lower overflow signals, synchronizes the upper and lower overflow signals to a clock signal, and provides synchronized upper and lower overflow signals to the first counter.

\* \* \* \* \*